United States Patent
Cho

[11] Patent Number: 5,641,711
[45] Date of Patent: Jun. 24, 1997

[54] LOW DIELECTRIC CONSTANT INSULATION IN VLSI APPLICATIONS

[75] Inventor: Chih-Chen Cho, Richardson, Tex.

[73] Assignee: Texas Instruments Incorporated, Dallas, Tex.

[21] Appl. No.: 234,443

[22] Filed: Apr. 28, 1994

[51] Int. Cl.$^6$ .................................................. H01L 21/46

[52] U.S. Cl. .................... 438/763; 427/255.5; 438/624; 438/631

[58] Field of Search .................... 437/195, 228 H, 437/235, 238, 927, 255.5; 148/DIG. 73

[56] References Cited

U.S. PATENT DOCUMENTS

| | | | |
|---|---|---|---|
| 5,290,358 | 3/1994 | Rubloff et al. | 118/715 |
| 5,310,700 | 5/1994 | Lien et al. | 437/195 |
| 5,512,775 | 4/1996 | Cho | 257/522 |

Primary Examiner—John Niebling
Assistant Examiner—C. Everhart
Attorney, Agent, or Firm—James E. Harris; Richard L. Stoltz; Richard L. Donaldson

[57] ABSTRACT

A semiconductor device and process for making the same with reduced capacitance between adjacent conductors on a connection layer. This technique works best at narrow conductor spacing (less than 1 micron), where the need for lower dielectric constant intralayer insulation materials accelerates. Directional deposition of a dielectric layer 14 at an acute angle relative to the plane of a semiconductor substrate 10 forms bridges between the tops of narrowly spaced conductors 12, resulting in the formation of one or more gas dielectric regions 18. The process is self-aligning, using the shadowing effect of the conductors themselves to mask deposition of dielectric material between them, and only bridges between conductors which are closely spaced. Subsequent deposition of an interlayer dielectric 20 completes a typical structure. The directional deposition method may, for instance, be electron beam evaporation of a material such as $SiO_2$, $Si_3N_4$, polyimide, or amorphous Teflon.

12 Claims, 4 Drawing Sheets

LOW DIELECTRIC CONSTANT INSULATION IN VLSI APPLICATIONS

FIELD OF THE INVENTION

This invention relates generally to the fabrication of semiconductor devices, and more particularly to methods and structures for reducing capacitive coupling on a connection layer of a semiconductor device. These methods are particularly important for VLSI (very large scale integration) circuits with features less than 1 micron in width.

BACKGROUND OF THE INVENTION

Semiconductors are widely used in integrated circuits for electronic devices such as computers and televisions. These integrated circuits typically combine many transistors on a single crystal silicon chip to perform complex functions and store data. The need to integrate more functions and more storage capacity onto a chip has caused the semiconductor industry to search for ways to shrink, or scale, the size of individual transistors and other devices commonly integrated on a chip. However, scaling devices to smaller dimensions can create a multitude of undesirable effects. One of these effects is an increase in the capacitive coupling between conductors in a circuit, since the capacitive coupling is inversely proportional to the distance between the conductors. This coupling may limit the ultimate speed of the device or otherwise inhibit proper device operation, if steps are not taken to reduce the coupling.

The capacitance between conductors is also highly dependent on the insulator, or dielectric, used to separate them. Conventional semiconductor fabrication commonly employs silicon dioxide as a dielectric, which has a dielectric constant of about 3.9. The lowest possible dielectric constant, 1.0, is the dielectric constant of a vacuum. By substituting a partial vacuum for a silicon dioxide dielectric between conductors, capacitive coupling would be reduced by a rough factor of 3.9, as one example.

Others have devised methods for creating partial vacuum dielectrics on semiconductor devices to reduce capacitive coupling. One method in particular (U.S. Pat. No. 4,987,101) comprises depositing a temporary dielectric layer of a material such as poly-para-xylylene between conductors, capping the structure with a layer of oxide, etching holes through the cap layer, selectively removing the temporary dielectric layer, and patching the holes. This method is rather complex and requires a large number of processing steps to create partial vacuum dielectrics. The process may also adversely affect the structural strength and heat transfer capability of the device.

SUMMARY OF THE INVENTION

The present invention is a method and structure for selectively lowering capacitive coupling between horizontally adjacent conductors on a semiconductor device. The present invention is apparently the first to provide for the selective creation of partial vacuum dielectric regions, or gas dielectrics, without requiring the deposition and removal of temporary solid dielectrics or the creation and plugging of removal holes in a capping layer. Previous methods also created large voids or areas of temporary (permanent if not removed) dielectric between widely spaced conductors, these areas having limited structural and heat-dissipating capabilities. One important advantage of the present invention is that gas dielectric regions are created only where they are needed most; i.e. between horizontally adjacent, narrowly spaced conductors. Widely spaced conductors generally have a relatively small capacitive coupling, even with solid dielectrics. Therefore, overall device characteristics may be better enhanced by maintaining a solid, structurally rigid, and heat conducting dielectric interspersed between widely spaced conductors.

Another advantage of the present invention is that the conductors are self-masking, so the structure enclosing a gas dielectric region is self-aligned. This allows gas dielectric regions to be formed by the method of the present invention in only one or two processing steps.

The present invention provides a method for fabricating intralayer dielectrics for semiconductor devices with reduced dielectric constant regions between narrowly spaced conductors. The method can comprise forming a layer of patterned conductors on a substrate and directionally depositing a dielectric material upon the conductors and the substrate, such that at least one of the conductors partially occludes the deposition of the dielectric material on a neighboring conductor. The method can further comprise forming one or more dielectric bridges between at least one neighboring pair of the conductors, creating gas dielectric regions beneath the bridges. Preferably, the bridges are formed by controlling the directional deposition of dielectric material to the point that material deposited on the facing sides and tops of adjacent conductors finally results in a connected structure being formed between the adjacent conductors.

Also according to the present invention, a semiconductor device may be fabricated. Preferably, this device may comprise first, second, and third conductors, with the first and second conductors separated by a space of less than the height of the conductors, and the second and third conductors separated by a space greater than the height of the conductors. This device may further comprise a bridge of dielectric material connecting the first and second conductors, with a gas dielectric region partially filling the space defined by the substrate, first and second conductors, and dielectric bridge. This device may further comprise a solid dielectric material, or a material which does not completely bridge but may create small void regions, deposited between the second and third conductors.

BRIEF DESCRIPTION OF THE DRAWINGS

This invention, including the features and advantages thereof, can be best understood by reference to the following drawings, wherein.

DETAILED DESCRIPTION OF THE PREFERRED EMBODIMENTS

Figure 1A:
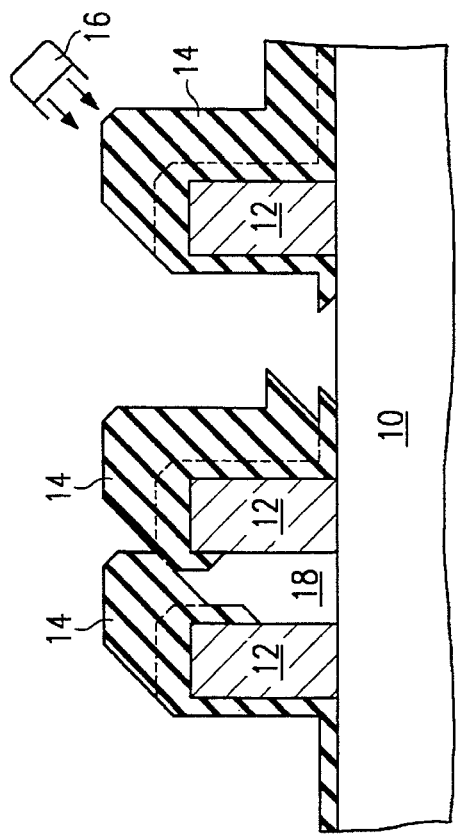
FIGS. 1A–1D are cross-sectional views showing the progressive steps in the fabrication of a dielectric layer, including 3 separate directional depositions of a dielectric material and a final planarizing deposition of dielectric material, whereby a gas dielectric is created between closely spaced conductors.

In one embodiment, this invention provides a method for fabricating gas dielectrics between closely spaced conductors, using a directional deposition technique and a self-masking feature of the conductors themselves. The method of this embodiment is illustrated in FIG. 1. With reference to FIG. 1A, three pre-existing conductors 12 are illustrated in cross-section on a substrate 10, which may be an actual semiconductor substrate or an interlayer dielectric on a semiconductor device. A directional deposition source 16 (not shown to scale) is positioned at an acute angle (45 degrees is selected for illustration purposes) relative to the plane of the substrate such that predominantly collimated dielectric material is directed at the surfaces of the device visible from the position of source 16. The directional deposition method may be, for example, electron beam evaporation or collimated physical vapor deposition. The dielectric material is preferably silicon dioxide, silicon nitride, polyimide, amorphous Teflon, or combinations thereof. Shadowed directional deposition techniques which create other structures are described in the literature (See U.S. Pat. No. 4,599,790). In this case, the directional deposition source 16 deposits a dielectric layer 14 primarily on the surfaces which are in its direct line of sight, including the right sidewalls and tops of conductors 12 and portions of the substrate 10 not occluded by conductors. The narrow space formed between the two leftmost conductors is partially shadowed, preventing dielectric material from reaching the bottom of the space or the lower sidewalls of the conductors. In this and other figures illustrating directional deposition, sharp edges are used to illustrate the directional nature of material growth, although some rounding will almost certainly occur in actual practice.

Figure 1C:
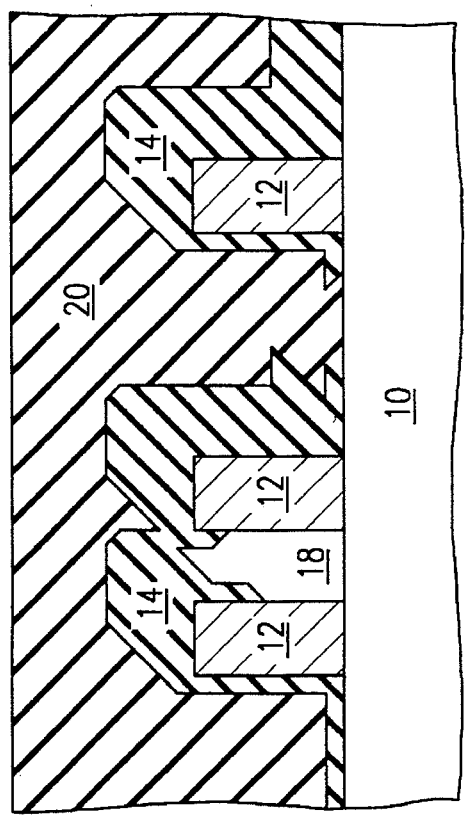
Figure 1B:
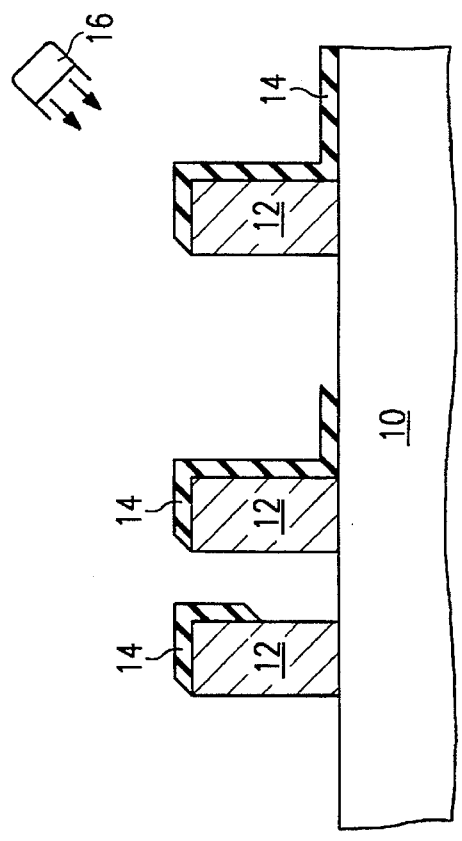

Referring now to FIG. 1B, the relative orientation of the substrate 10 and the source 16 has been changed, such that dielectric material is now directed roughly at the left sides and tops of the conductors 12. Additional dielectric material is added to layer 14 from this new orientation. In FIG. 1C, the relative orientation is preferably reverted back to the original orientation, and additional dielectric material is added to layer 14 until some point after the space between the two leftmost conductors is bridged, creating a partial vacuum region 18 (Deposition preferably occurs in a vacuum environment, at a typical pressure of about $10^{-6}$ Torr).

For structural reasons, it may be desirable to equalize the pressure of region 18 more nearly to ambient pressure. One method of accomplishing this would be to anneal the structure in a forming gas (10% $H_2$-90% $N_2$, for example) at ambient pressure and a temperature of 400 to 450 degrees C. for approximately an hour. This would allow $H_2$ molecules to penetrate the surrounding structure into, and thereby increase the pressure of, sealed gas regions.

Figure 1D:
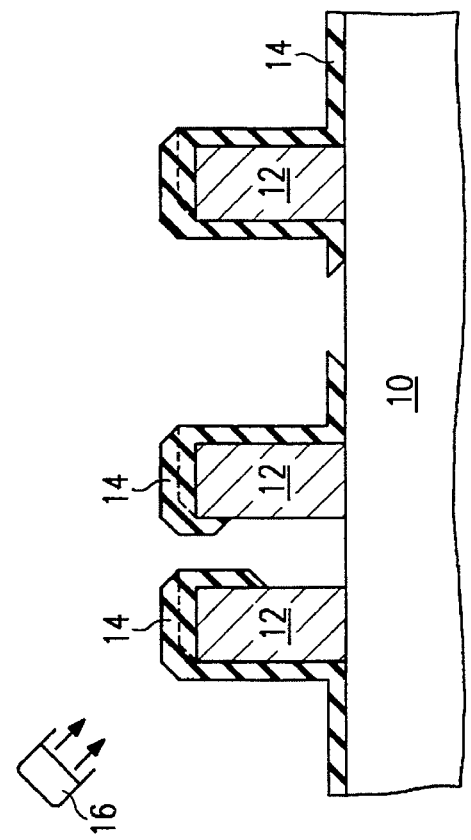

FIG. 1D shows the completed intralayer and interlayer dielectric structure. A preferably non-directional layer of dielectric material 20 is applied over the entire structure. This material may be the same as that used in layer 14, although many common dielectric materials and techniques may be used to create layer 20, with a particular choice depending primarily on device considerations other than those imposed by the present invention.

FIG. 1D illustrates several unique features of the present invention. First, because the dielectric bridges are self-aligning, smaller feature size actually increases the attractiveness of the invention: smaller spans require less deposition; shorter bridges are structurally stronger; and the relative percentage of gas dielectric increases with higher aspect ratio gaps, thus decreasing the dielectric constant of the gap even further. Secondly, large gaps between conductors are not bridged. This is generally an advantage, because: capacitive coupling across large gaps is relatively low, even with a solid dielectric material; a solid dielectric material allows large gaps to provide structural support and heat dissipation; no additional processing steps are required to create this effect.

Another feature of the present invention is that the bridge cross-section and maximum gap bridged by dielectric are controlled primarily by the directional deposition method, deposition angle relative to the plane of the substrate, and deposition time; even large gaps could theoretically be bridged at low grazing angles. However, practical implementation is generally limited to angles greater than 10 degrees, and preferably to angles greater than 20 degrees. Deposition at relatively high angles (greater than 45 degrees) is possible, although this builds material on the tops of conductors 12 faster than on the sides of the conductors, and limits the maximum bridge span.

Figure 2A:
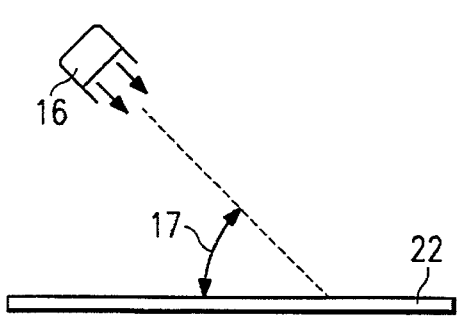
FIGS. 2A and 2B are a side and top view, respectively, showing a wafer and one possible relationship to a single fixed directional deposition source.
Figure 2B:
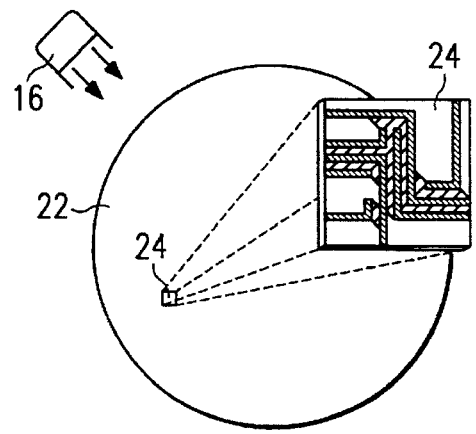

FIG. 2 shows a second embodiment of the invention, and more particularly illustrates the arrangement of apparatus in a typical embodiment. Referring to FIG. 2A, a side view of a semiconductor wafer 22 (typically containing many semiconductor chips which will be separated later) is shown in a relative position to a directional deposition source 16 at a deposition angle 17. FIG. 2B shows the same arrangement looking directly down on wafer 22. A small segment of the wafer 24 is shown magnified, to illustrate the miniature pattern of conductors on the wafer and a relationship to the single fixed directional deposition source 16.

Figure 3A:
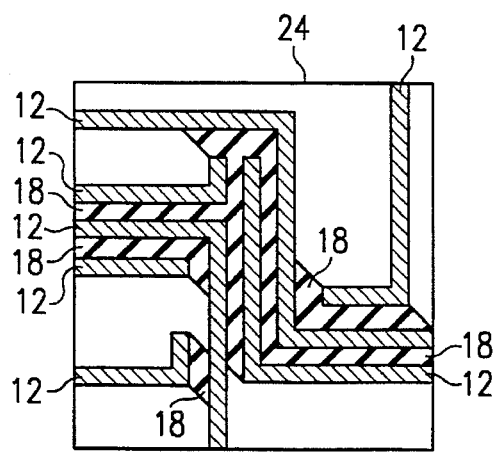
FIGS. 3A and 3B are a top and cross-sectional view, respectively, of a section of the wafer of FIGS. 2A and 2B, illustrating gas dielectric regions formed by the single fixed directional deposition of a dielectric material.

FIG. 3A shows the wafer segment 24 of FIG. 2B, after the directional deposition of dielectric has been completed. Locations of gas dielectric regions 18 created by the directional deposition are shown between narrowly spaced conductors 12. The gas dielectric regions are only created where the separation of adjacent conductors is small. An advantage of this embodiment is simplicity; if the patterned conductors primarily run perpendicular and parallel, a single fixed dielectric source can be positioned to create the dielectric bridges.

Figure 3B:
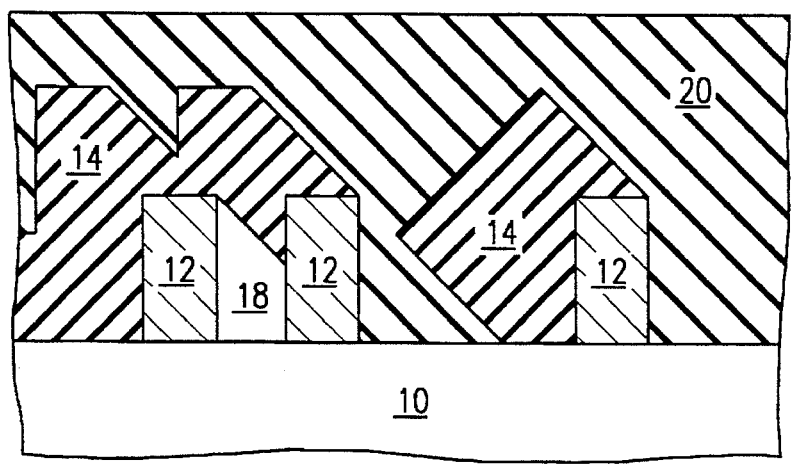

FIG. 3B shows a typical cross-section from the arrangement of FIG. 3A, after dielectric layer 20 has been applied. Because only one deposition angle was used, the bridge formed over gas dielectric region 18 is inclined. Also, an overhang structure is formed as part of directionally deposited dielectric layer 14 attached to the rightmost of the conductors 12.

Figure 4A:
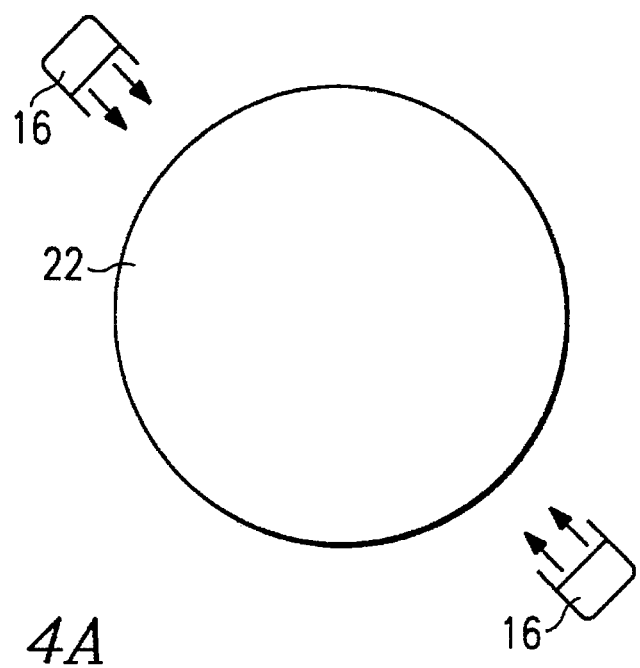
FIGS. 4A and 4B show another embodiment, wherein two fixed directional deposition sources create a different dielectric deposition cross-section.
Figure 4B:
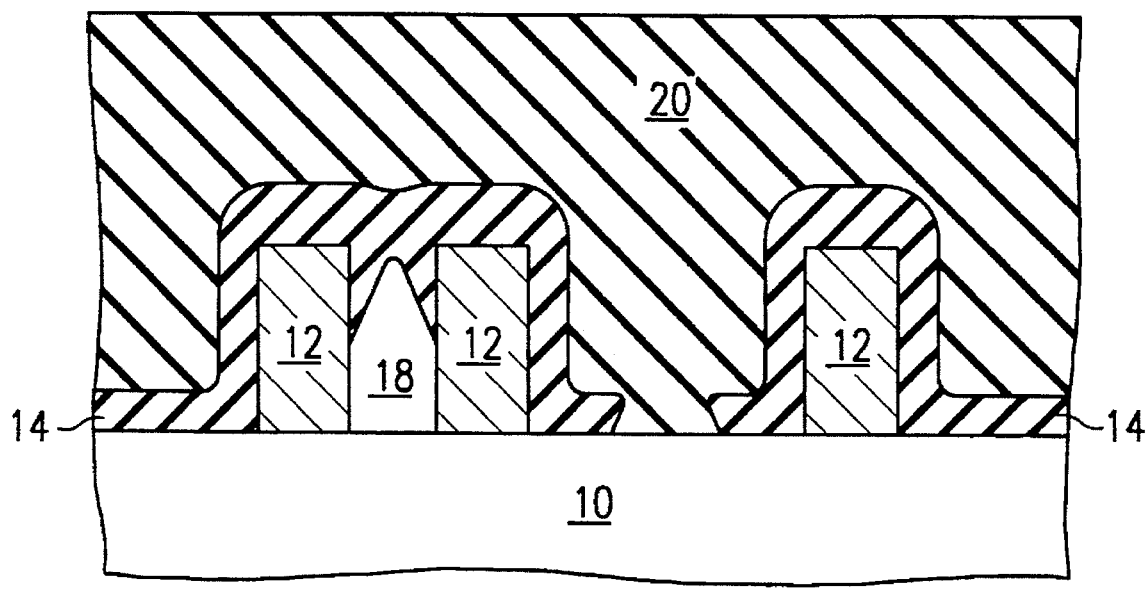

FIG. 4A shows a top view of another embodiment similar to that of FIG. 2, but with a second dielectric source 16 positioned on the opposite side of wafer 22 from the first dielectric source. With both sources operating simultaneously, this arrangement may produce a cross-section similar to that shown in FIG. 4B, wherein the large overhang of FIG. 3B is greatly reduced and the bridge structure is essentially symmetric.

Figure 5A:
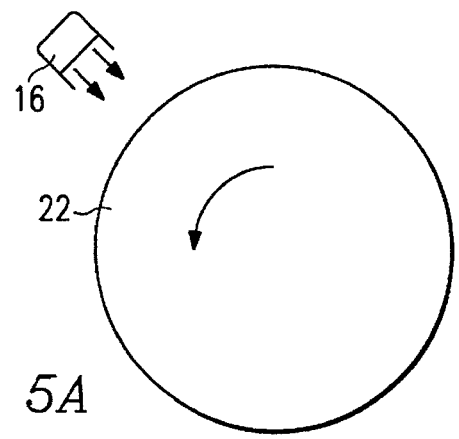
FIGS. 5A and 5B show another embodiment, wherein the wafer is spun in relation to a single directional deposition source, creating still another dielectric deposition cross-section.
Figure 5B:
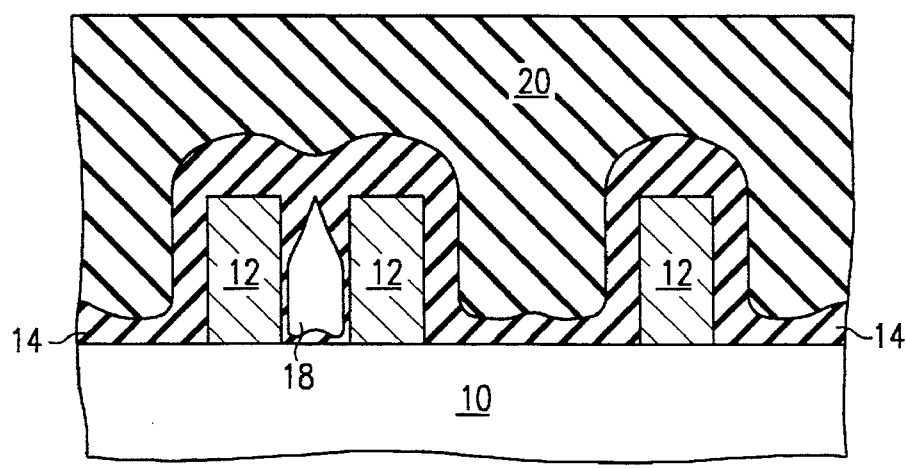

FIG. 5A shows a top view of still another embodiment, where wafer 22 is spun, perhaps on a platter, as dielectric source 16 operates. This may produce a cross section similar to that shown in FIG. 5B. Excepting small "box canyon" conductor formations on the wafer, all surfaces are illuminated by the source for at least a fraction of a wafer revolution. This results in some deposition of dielectric material on the lower sidewalls of and between conductors 12 occurring before the dielectric bridges are completed. The bridges still form, because the upper sidewalls of adjacent conductors are illuminated for larger fractions of a wafer revolution than the lower sidewalls. This process accelerates as the bridge closes, allowing smaller amounts of dielectric to fall into the gap with each revolution. An advantage of this embodiment is that the small layer of dielectric material adhering to the lower sidewalls of and between adjacent conductors could serve as a passivation layer, if such is needed.

Figure 6:
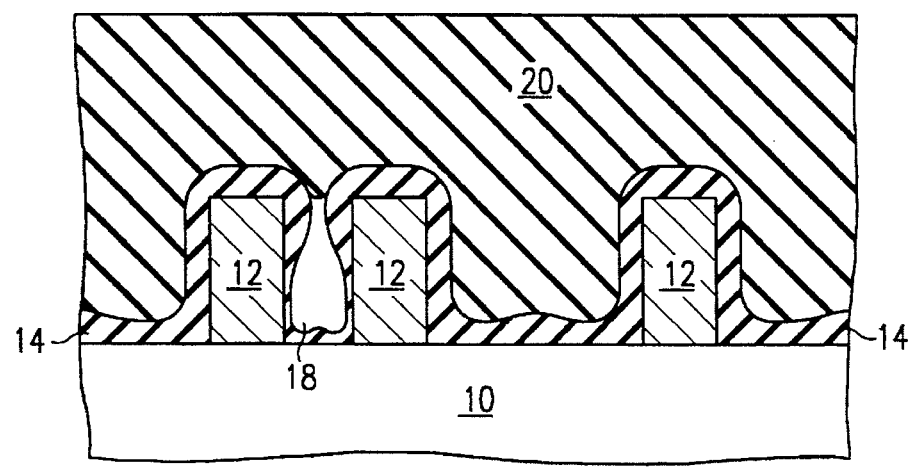
FIG. 6 shows yet another embodiment, wherein the directionally deposited dielectric does not completely bridge the gap between two closely spaced conductors, allowing the internal pressure of the gas dielectric to be equalized before the bridge is capped by the planar dielectric.

FIG. 6 shows a cross-section of an embodiment wherein the directional deposition of layer 14 is stopped before bridges are completely formed. This allows the structure to be exposed to near atmospheric pressure during the application of dielectric layer 20, as another method of equalizing pressure in gas dielectric region 18. This embodiment relies on some property of dielectric material 20 (surface tension in a spun-on glass, for example) to prevent an appreciable portion of dielectric material 20 from entering region 18 during deposition of layer 20.

The following table provides an overview of some embodiments and the drawings.

TABLE

| Drawing Element | Preferred or Specific Examples | Generic Term | Other Alternate Examples |
|---|---|---|---|
| 10 | Silicon | Substrate | Compound semiconductors (e.g. GaAs, InP, Si/Ge, SiC) Ceramic substrates Previous interlayer dielectric |
| 12 | AlCu alloy with Ti or TiN underlayers | Patterned conductors | Al, Cu, Mo, W, Ti, and alloys of these Polysilicon, silicides, nitrides, carbides |
| 14 | Silicon dioxide | Directionally deposited | Other oxides, doped $SiO_2$ Silicon nitride Polyimides, amorphous Teflon |
| 18 | Partial vacuum (about $10^{-6}$ Torr) | Gas dielectric region | $H_2$, inert gasses at various pressures from near perfect vacuum to roughly twice atmospheric pressure |
| 20 | Silicon dioxide | Interlayer dielectric | Other oxides, doped $SiO_2$, P-glass Silicon nitride |

The invention is not to be construed as limited to the particular examples described herein, as these are to be regarded as illustrative, rather than restrictive. The invention is intended to cover all processes and structures which do not depart from the spirit and scope of the invention. For example, it would be immediately obvious to one skilled in the art that a directional deposition device could be operated for relatively short periods of time at incident angles greater than 75 degrees without violating the spirit of the invention, or that the deposition device could rotate around the wafer. Additional layers which have not been illustrated (passivation layers, capping layers, etc) are also comprehended by the invention. The particular cavity shapes shown for containing a gas dielectric are illustrative, and many other cavity shapes may be formed in the practice of this invention. Properties of some of the specific examples may be combined without deviating from the nature of the invention.

What is claimed is:

1. A method of forming an intralayer dielectric for semiconductor devices, said method comprising:

providing a layer of patterned conductors formed on a substrate, said conductors each having substantially the same vertical conductor thickness, said layer comprising a first pair of neighboring conductors horizontally separated by less than said vertical conductor thickness and a second pair of neighboring conductors horizontally separated by greater than said vertical conductor thickness;

directionally depositing a first layer of dielectric material upon said conductors and said substrate, such that one of said first pair of conductors partially occludes the deposition of said dielectric material on the other of said first pair, and such that deposition of said dielectric material on each of said second pair of conductors is unoccluded by the other of said second pair; and forming a dielectric bridge between said first pair of conductors, thereby creating a gas dielectric region between said first pair of conductors, whereby the effective capacitance between said first pair of conductors is selectively lowered by formation of the gas dielectric region.

2. The method of claim 1, wherein said step of forming a dielectric bridge between said first pair of conductors comprises:

terminating said directionally depositing step before said dielectric material has reached a thickness necessary to completely bridge between said first pair of neighboring conductors; and applying a second layer of a dielectric material which completely bridges between said first pair of conductors.

3. The method of claim 2, wherein said second layer of a dielectric material is applied at a greater gas pressure than said first layer of a dielectric material.

4. The method of claim 1, wherein said step of directionally depositing a dielectric material comprises:

(a) maintaining an angle of 5 to 75 degrees, during said depositing step, between a directional deposition source and a wafer having a defined surface plane and containing said substrate, said angle measured with respect to said surface plane of said wafer; and (b) operating said dielectric source at two or more separate orientations of said source and said wafer, said orientations projected onto said surface plane of said wafer and measured relative to an imaginary reference line on said surface plane of said wafer.

5. The method of claim 4, wherein said angle is maintained between 15 and 45 degrees.

6. The method of claim 4, wherein said operating step further comprises rotating the relative orientation of said source and said wafer about the normal line to said surface plane of said wafer, said rotation being continuous during the greater part of said operating step.

7. The method of claim 4, wherein said operating step further comprises intermittently rotating said relative orientation of said source and said wafer to at least two discrete orientations.

8. The method of claim 1, wherein said depositing step comprises:
  (a) maintaining an angle of 5 to 75 degrees, during said depositing step, between each of one or more directional deposition sources and a wafer having a defined surface plane and containing said substrate, said angle measured with respect to said surface plane of said wafer;
  (b) operating said dielectric sources at fixed orientations relative to said wafer, said fixed orientations projected onto said surface plane of said wafer and measured relative to an imaginary reference line on said surface plane of said wafer.

9. The method of claim 8, wherein said angle is maintained between 15 and 45 degrees.

10. The method of claim 1, further comprising:
  (a) forming a second layer of dielectric material with a thickness at least that necessary to cover said conductors; and
  (b) planarizing topmost surfaces of said dielectric materials.

11. The method of claim 1, further comprising annealing said device in a forming gas, whereby internal pressure in said gas insulator regions is raised to a value of at least 0.1 atmospheres.

12. The method of claim 11, wherein said forming gas comprises $H_2$ and $N_2$.

* * * * *